(12) United States Patent
Sherwood et al.

(10) Patent No.: US 8,004,288 B1
(45) Date of Patent: Aug. 23, 2011

(54) METHODS AND APPARATUS FOR TESTING OF HIGH DIELECTRIC CAPACITORS

(75) Inventors: Gregory J. Sherwood, North Oaks, MN (US); Francis Wang, Minneapolis, MN (US); Keith R. Maile, New Brighton, MN (US); Ignacio Chi, Mahtomedi, MN (US)

(73) Assignee: Cardiac Pacemakers, Inc., St. Paul, MN (US)

( * ) Notice: Subject to any disclaimer, the term of this patent is extended or adjusted under 35 U.S.C. 154(b) by 732 days.

(21) Appl. No.: 12/120,092

(22) Filed: May 13, 2008

Related U.S. Application Data

(60) Provisional application No. 60/917,677, filed on May 14, 2007.

(51) Int. Cl.
G01R 31/12 (2006.01)
G01R 31/08 (2006.01)
G01R 31/00 (2006.01)

(52) U.S. Cl. ............... 324/548; 324/522; 324/750.03
(58) Field of Classification Search ............... 324/548, 324/522, 750.03
See application file for complete search history.

(56) References Cited

U.S. PATENT DOCUMENTS

| 5,510,719 | A | * | 4/1996 | Yamamoto ............ 324/548 |
| 5,677,634 | A | * | 10/1997 | Cooke et al. ............ 324/548 |
| 6,476,617 | B1 | * | 11/2002 | Kawaguchi et al. ...... 324/548 |
| 7,540,885 | B2 | * | 6/2009 | Kamitani ............ 29/25.03 |

* cited by examiner

*Primary Examiner* — Amy He
(74) *Attorney, Agent, or Firm* — Schwegman, Lundberg & Woessner, P.A.

(57) ABSTRACT

The present subject matter provides apparatus and methods for testing high dielectric capacitors. A testing process whereby voltage and temperature is varied to provide temperature dependent plots to determine the reliability of a capacitor is provided. A testing system is demonstrated to measure capacitor reliability and/or relative capacitor reliability.

20 Claims, 5 Drawing Sheets

METHODS AND APPARATUS FOR TESTING OF HIGH DIELECTRIC CAPACITORS

CROSS REFERENCE TO RELATED APPLICATION

This application claims the benefit of priority, under 35 U.S.C. Section 119(e) to U.S. Provisional Application Ser. No. 60/917,677, filed May 14, 2007, the specification of which is herein incorporated by reference in its entirety.

FIELD OF THE INVENTION

The present subject matter relates generally to methods and apparatus for testing capacitors and more particularly to methods and apparatus for testing capacitors having high dielectric coefficients.

BACKGROUND

The reliability of a typical capacitor is verified over parameter ranges which traditionally are designed to test the capacitor at extreme operating values. For example, a capacitor may be temperature-cycled from about zero degrees Celsius to over 250 degrees Celsius while monitoring its performance to determine if it is operating within acceptable tolerances. The voltage applied to the capacitor can also be cycled either independently or at the same time as the temperature testing to identify nonstandard or defective devices. Such testing is useful and will accurately identify acceptable capacitors over their extreme parameter ranges.

Such a testing paradigm assumes that the capacitor's physical properties do not substantially change over the course of testing. This was a good assumption for most traditional capacitor designs; however, more recent types of ceramic dielectric materials and electrode combinations demonstrate substantially different electrical properties at temperatures and/or voltages which are much different than the extreme values over which capacitors have been traditionally tested. Consequently, there is a need in the art for new capacitor testing methods and apparatus which accounts for changing physical properties over the temperature and voltage ranges of interest. Such testing methods and apparatus should reliably identify devices which cannot meet predetermined tolerances or which fail upon testing.

SUMMARY

This application addresses the foregoing needs in the art and other needs not discussed herein. The present subject matter provides apparatus and methods for testing high dielectric capacitors. A testing process whereby voltage and temperature is varied to provide temperature dependent plots to determine the reliability of a capacitor is provided. A testing system is demonstrated to measure capacitor reliability.

This Summary is an overview of some of the teachings of the present application and is not intended to be an exclusive or exhaustive treatment of the present subject matter. Further details about the present subject matter are found in the detailed description and the appended claims. The scope of the present invention is defined by the appended claims and their equivalents.

DETAILED DESCRIPTION

Figure 1:
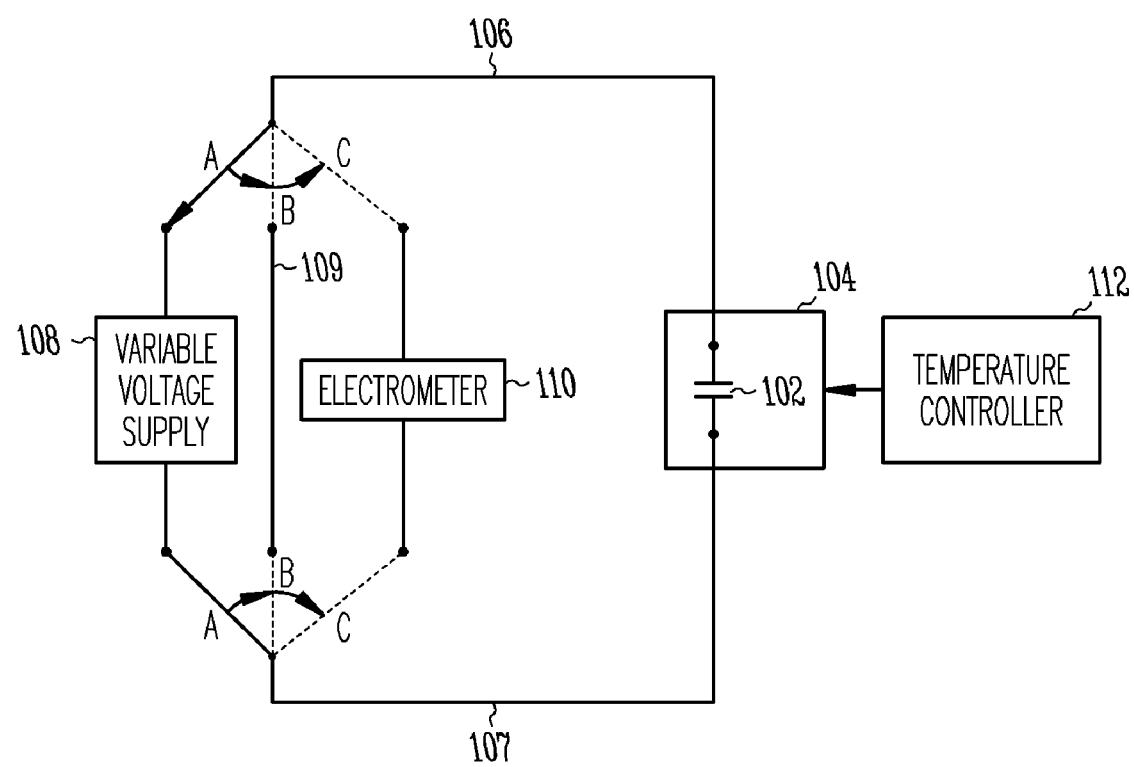
FIG. 1 is a block diagram showing one testing configuration according to one embodiment of the present subject matter.

The following detailed description of the present invention refers to subject matter in the accompanying drawings which show, by way of illustration, specific aspects and embodiments in which the present subject matter may be practiced. These embodiments are described in sufficient detail to enable those skilled in the art to practice the present subject matter. References to "an", "one", or "various" embodiments in this disclosure are not necessarily to the same embodiment, and such references contemplate more than one embodiment. The following detailed description is, therefore, not to be taken in a limiting sense, and the scope is defined only by the appended claims, along with the full scope of legal equivalents to which such claims are entitled.

Certain capacitor designs exhibit changing physical properties with applied voltages at relatively low temperatures. Such changes may take time to observe, but they can be dramatic. The present application provides methods and apparatus for detecting capacitors likely to fail or change from accepted tolerances over time.

One example of capacitors which may exhibit substantially different physical properties with an applied voltage and relatively moderate temperatures are barium titanate capacitors. Constant voltage bias application on a barium titanate capacitor with nickel electrodes can result in a reduction in the insulation resistance of the dielectric and hence an electrical leakage path is created. Continued bias of the capacitor results in a drain of energy from any power source designed to maintain the charge on the capacitor. Therefore, in applications such as implantable medical devices where biases need to be maintained, the overall undesired effect is decreased life of the implantable medical device.

Barium titanate ceramic capacitors were historically made using non-oxidizing precious metals including, but not limited to metals such as platinum, silver, and palladium. As these metals became more expensive, nickel was used to replace them. Since nickel oxidizes, a specialized production process which limited oxygen exposure during a high temperature firing process was employed. Such process does keep the nickel from oxidizing but can starve the titanate of oxygen, thus creating a non-stochiometric balance in the dielectric. These oxygen vacancies have mobility under bias and therefore can move over time. It is believed that these oxygen vacancies can move at relatively low temperature.

The mobility of the vacancies and other charged species (for example, dopants and contaminants) can collect at the electrodes, creating charge concentrations at the electrode/dielectric interface. A p-n junction can form (it is p-type from the slightly oxidized nickel, n-type from the reduced barium titanate). An electrical leakage path can be created that is very sensitive to thermal conditions. Higher temperatures drive the chemical potentials to counteract the electrical potentials and leakage will decrease. No electrical potential allows the chemical potential to drive the charged species back into equilibrium, also reducing the leakage value compared to the biased condition.

Various testing configurations have been developed to demonstrate different testing apparatus aspects. Various testing methods have also been developed to characterize the reliability of capacitor designs. FIG. 1 is a block diagram showing one testing configuration according to one embodiment of the present subject matter. The capacitor 102 is placed in a temperature chamber 104 and electrically connected to leads 106 and 107 which extend outside of chamber 104. Leads 106 and 107 can be connected to variable voltage source 108, shorting connection 109, or to electrometer 110. This can be accomplished by automatic or manual operations. In automated embodiments a multiposition switch can provide the necessary switching. In manual embodiments, the switching can be performed by switches or by changing connections.

Variable voltage source 108 can apply a voltage bias to the capacitor 102 when it is connected and turned on. Chamber 104 has a temperature controller 112 which in various embodiments can set the temperature of chamber 104 to a desired temperature, and can change the temperature within chamber 104 at a relatively controlled rate which is selectable or programmable. One such device that can be used for chamber 104 is the TSC II by Setaram Instrumentation. Other chambers and controllers 112 may be employed without departing from the scope of the present subject matter.

Figure 2:
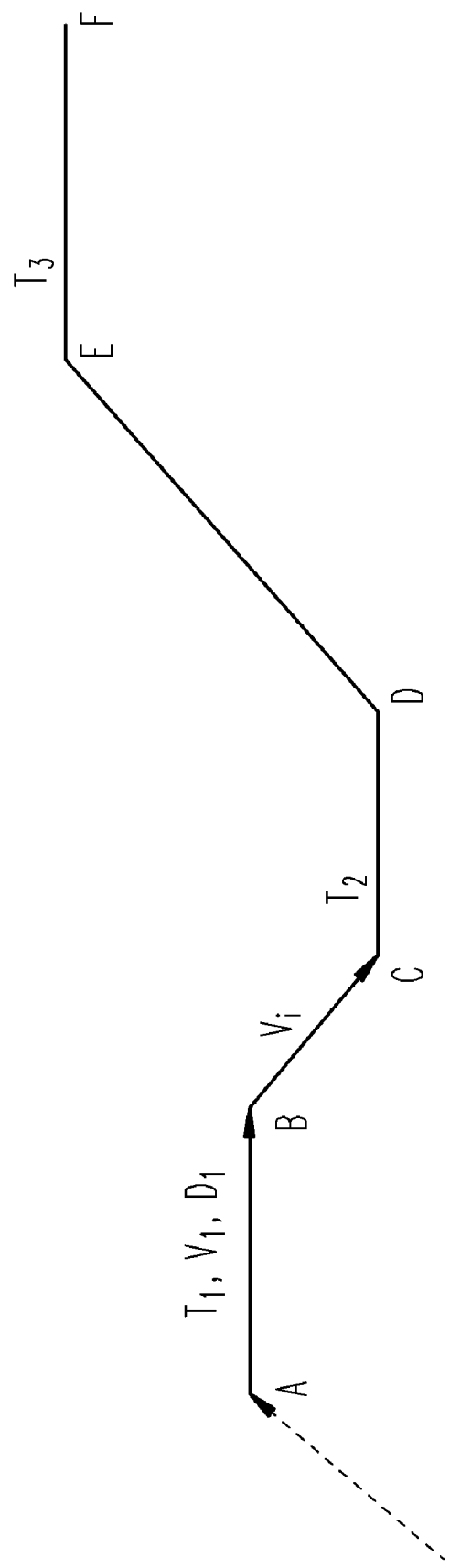
FIG. 2 is a process diagram showing one testing process according to one embodiment of the present subject matter.

FIG. 2 is a process diagram showing one testing process according to one embodiment of the present subject matter. In one embodiment, the capacitor 102 is connected to leads 106 and 107 and the temperature is raised to a first temperature T1 (see point A on FIG. 2). The capacitor 102 is connected to voltage source 108 and a voltage V1 is applied to the capacitor 102 for a duration D1. After duration D1 (at point B), the voltage V1 is maintained, but temperature is reduced to temperature T2. In one embodiment the reduction is performed at a constant rate of reduction. In one embodiment the reduction is not performed at a constant rate of reduction. The voltage source 108 is disconnected when the system reaches temperature T2 (at point C). The capacitor 102 is shorted for a period of time sufficient to attain electrical equilibrium (same voltage on both plates) using shorting connection 109. The shorting connection 109 is disconnected from capacitor 102 and an electrometer 110 is connected (at point D) to leads 106 and 107 to measure current flow as temperature is increased at a relatively constant rate to temperature T3 (from points D to E). In one embodiment, the electrometer is a Keithley Model Number 6517A, capable of measurements to $1\times10^{-15}$ Amp or 1 femtoamp. Other very sensitive current measurements and measuring devices may be used without departing from the scope of the present subject matter. As the temperature is controllably increased, the chamber is eventually raised to temperature T3. The resulting measured current and temperature are recorded as shown in one of the plots in FIG. 3, which is a plot of current versus temperature for three different capacitors subjected to the process of FIG. 2.

The process demonstrated by FIG. 2 uses temperature T1 at voltage V1 to mobilize any ionic species in the dielectric towards an electrode. A negative charged species will move toward the anode and a positive charged species will move toward the cathode. In one application, T1 is selected to be high enough to enhance mobility for the given time D1 of polarization, but low enough to physically alter or destroy the dielectric. Voltage V1 is set to as high a voltage as possible without incurring dielectric breakdown, such as the rated maximum operating voltage for the capacitor. Once the defects are pulled apart by the temperature and voltage, the drop in temperature from point B to point C at a constant voltage is intended to limit the movement of the charged species within the dielectric. Temperature T2 is selected to "freeze" the species in position. It is selected in view of the thermal diffusion imparted on the charged species and may vary for different dielectrics. The capacitor is shorted for a time sufficient to equalize the voltage on the plates and to achieve thermal equilibrium throughout the bulk of the dielectric material. Such a time will be shorter for small capacitors and longer for larger capacitors and may vary as a function of the specific heat of the dielectric material.

The electrometer 110 is connected to the terminals and current is measured very accurately starting at point D. At point D a constant increase in temperature is imparted to the capacitor. The rate is selected to stimulate current generation from the capacitor. In one embodiment, seven degrees Celsius per minute is employed to see the currents generated. Thus, the rate may change; however, if the rate is too small, the current observed will be within the noise level of the capacitor current output. If the rate is too high the current observed will not be thermal equilibrium resulting in a lag in current response with respect to applied temperature. Another consideration is that if the rate is varied, the peaks will shift to a higher temperature and may inaccurately portray the peaking of current with respect to temperature.

At point E the temperature T3 is stabilized to see the current fall off. This is typically observed in a short amount of time; for example, one minute. The temperature T3 is selected to be high enough to allow the species to easily move within the dielectric. Therefore the time it takes for the current to fall off is on the order of the relaxation time of the dielectric material.

These temperatures, times/durations, voltages, and rates may vary according to best practices for a particular capacitor and/or particular dielectric material.

In one application for barium titanate capacitors, having a capacitance of anywhere between 1 nF and 100 uF, T1 is 175 degrees and V1 is the rated maximum operating voltage for the component (e.g., 6.3 to 16 volts for capacitors having those maximum voltage ratings). It is understood that the exact value of V1 can be higher as long as the test does not cause dielectric breakdown. In such an application an example of D1 is about 5 to 500 minutes. In one embodiment D1 is about 15 minutes. In one embodiment, D1 is about 20 minutes. In one embodiment, T2 is 30 degrees Celsius and the time from point C to point D is about 10 minutes. The rate of temperature variation used was about 7 degrees Celsius per minute, however, other rates can be used. It is understood that other settings may be used without departing from the scope of the present subject matter. The numbers set forth herein are intended to demonstrate a way of conducting the testing, but are not intended to be exhaustive or limited.

Figure 3:
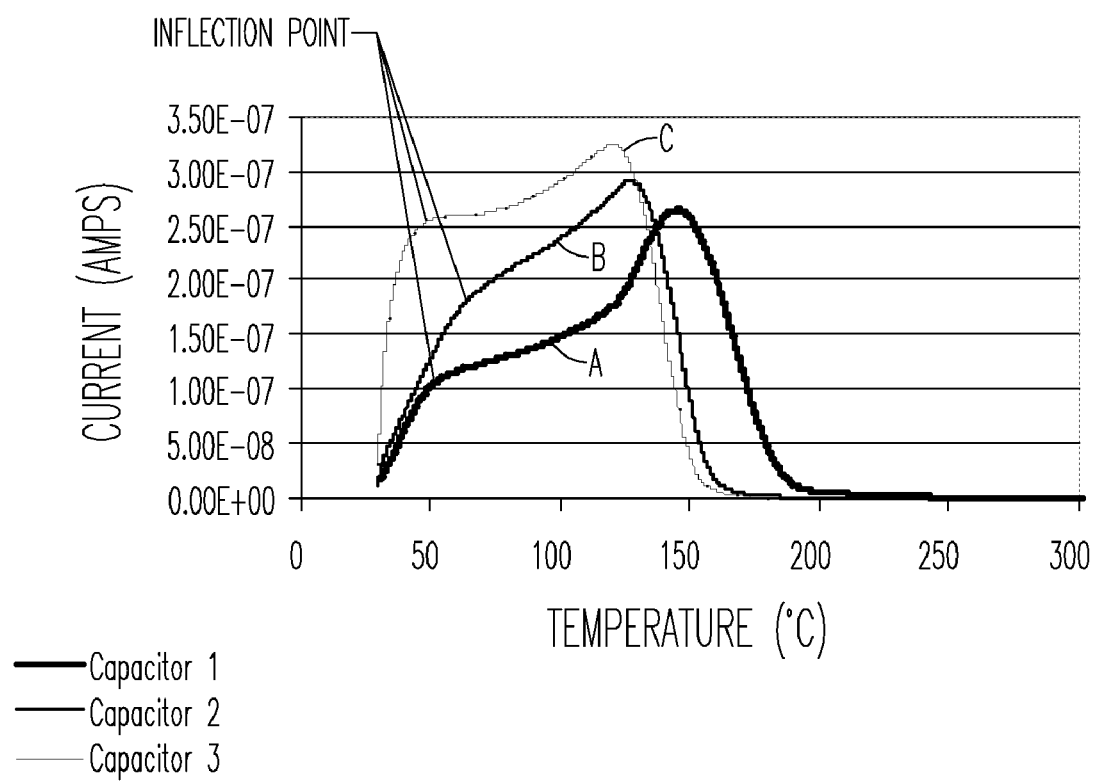
FIG. 3 is a plot of current versus temperature for three different capacitors subjected to the process of FIG. 2.

FIG. 3 is a plot of current versus temperature for three different capacitors subjected to a testing process, such as the process of FIG. 2. The process was repeated using identical temperatures, times/durations, voltages, and rates for each capacitor. Each capacitor had the same type dielectric material, electrode material, and maximum voltage rating. The tests show that different capacitors exhibit different thermally-stimulated response curves. Curve A shows an inflection point (see the arrows in the FIG.) at relatively low temperature (about 65 degrees Celsius in this example). The inflection point for the other curves B and C is found at progressively higher currents. These inflection points are believed to be related to charge concentration that leads to leakage current. Consequently, the lower the current value at the inflection point of the curve, the lower the resulting leakage current from the tested capacitor. This approach can be used to predict long term performance of the capacitor.

If the capacitor is stable over multiple runs, the capacitor could be used as a test reference for benchmarking performance of other capacitors in test. Such a system could, in one embodiment, test capacitors in parallel to equalize the effects of thermal variation due to repeated testing.

The second peak relates to the Curie temperature of the dielectric. Multiple aspects will determine that peak. For instance, one effect is where a crystalline form changes from tectragonal to cubic structure is observed in a barium titanate dielectric. Another aspect is the measurement of oxygen vacancies within a single grain of the dielectric as observed over the bulk of the grains of the particular capacitor dielectric. Another aspect is the pyroelectric current associated with that particular dielectric material.

Consequently, plots like those of FIG. 3 give relative performance indications of different capacitors over the same operation paradigm and can be used to select components exhibiting stable and low leakage current parameters.

Figure 4:
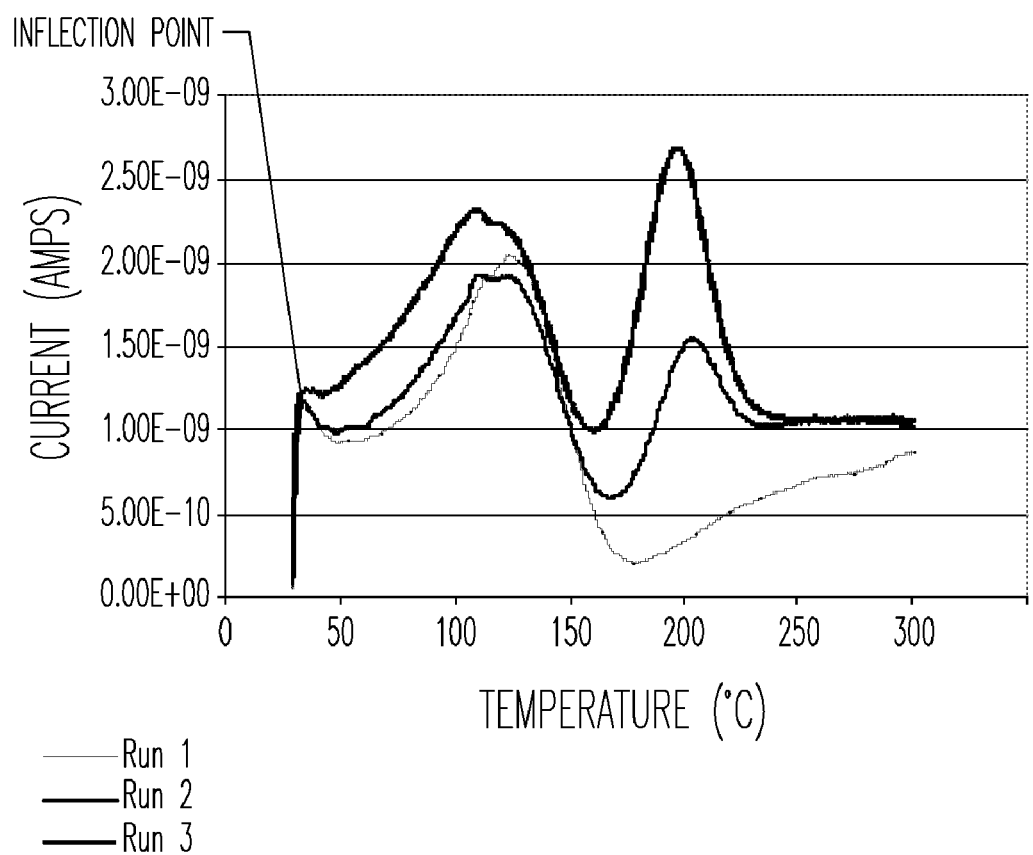
FIG. 4 is a plot of current versus temperature for a capacitor subjected to the process of FIG. 2 on three different runs.

FIG. 4 is a plot of current versus temperature for a capacitor subjected to the process of FIG. 2 on three different runs. The data from such testing shows the reliability and repeatability of leakage current parameters of a single capacitor. Thus, this type of testing can be used to demonstrate that the capacitor is stable over multiple uses.

In FIG. 4, the various plots demonstrate an unstable capacitor with respect to measured leakage current effects over the various runs. The lack of repeatability of temperature stimulated current shows that the device is not stable. Whether it is stable enough for certain applications is a function of the desired tolerance of behavior. In FIG. 4 current measurements in each scan at about 65 degrees Celsius (after an observed inflection point of about 40 degrees Celsius) are progressively higher in magnitude. This effect demonstrates a changing leakage current as the device is cycled through multiple uses. Further evidence of parameter change is found by shifts in the peak current observed at about 130 degrees Celsius. By inspection, the peaks at later scans are occurring at progressively lower temperatures than those of earlier scans, which is indicative of increasing mobility of the charged species as the peaks shift downward in temperature.

For barium titanate dielectric capacitors, a peak current around 200 degrees Celsius is indicative of oxygen (or other charged species) vacancies traveling across grain boundaries due to thermal diffusion at this temperature. FIG. 4 demonstrates that in devices that exhibit unstable parameter change, the peak will vary from basically nonexistent to a relatively large and visible peak. This is another aspect of varying parameters over different runs that can be used to detect nonstandard or defective capacitors.

These aspects can be used to determine capacitors which are unsuitable for long term, stable operation.

In one embodiment, the scans of FIG. 3 can be used independently to assess different capacitor performance. In one embodiment, the capacitors selected based on the scans of FIG. 3 are further tested using the scans of FIG. 4 to determine whether the capacitor performs within acceptable tolerances.

In one embodiment, the scans of FIG. 4 are used independently to determine whether a particular capacitor is stable. In one embodiment, the capacitors chosen after such scans are then scanned according to the system of FIG. 3 to determine relative performance of the capacitors.

Other testing processes are possible without departing from the scope of the present subject matter.

Figure 5:
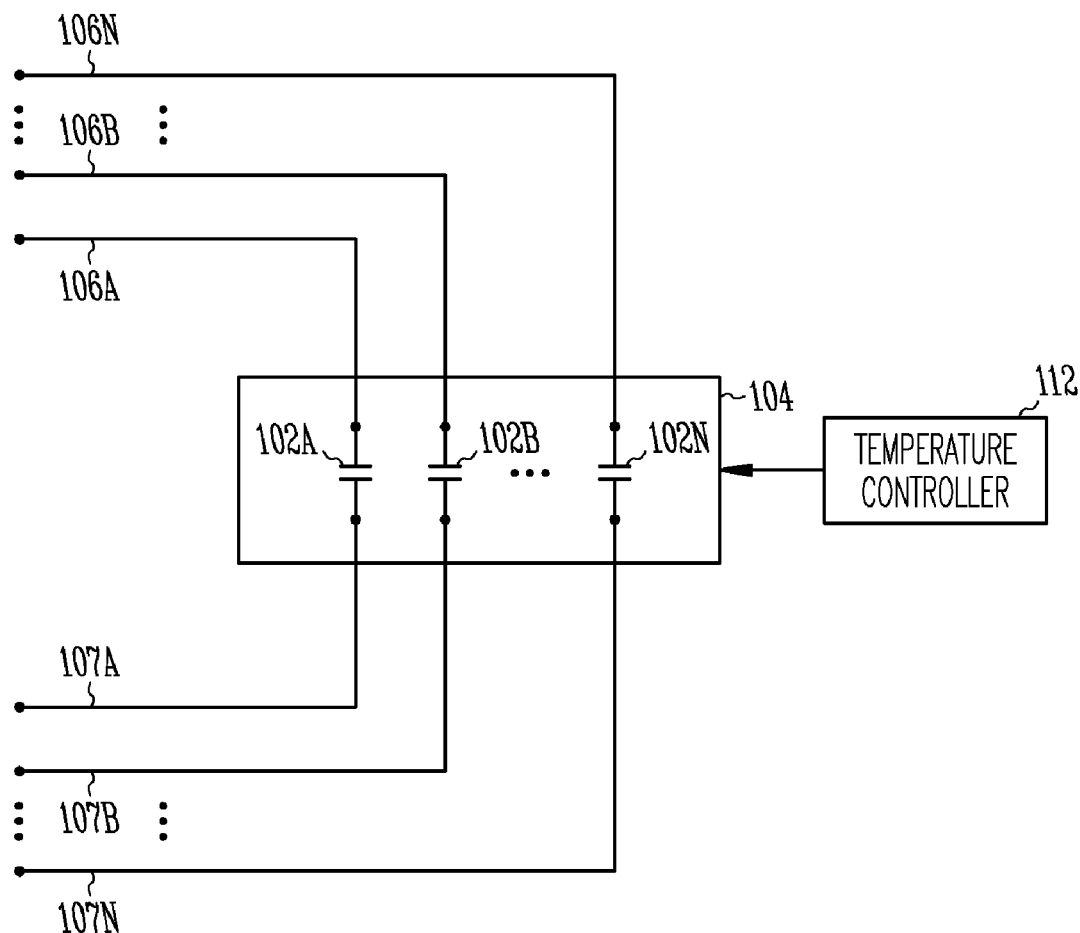
FIG. 5 is a block diagram showing one testing configuration including a plurality of capacitors under test according to one embodiment of the present subject matter.

FIG. 5 is a block diagram showing one testing configuration including a plurality of capacitors (102a . . . n) under test according to one embodiment of the present subject matter. It is understood that the capacitors can all be tested at the same time and over the same temperature conditions to eliminate skew and error in compared data due to temperature change variation. It is also understood that in various embodiments, the voltage source 108 can be connected to each capacitor in parallel to create equipotential testing of various capacitors. Single or multiple variable voltage supplies 108 and shorting connections 109 are optionally used (not shown); however, individual electrometers 110a . . . n (not shown) must be used to simultaneously measure the temperature stimulated current of each capacitor.

This application is intended to cover adaptations or variations of the present subject matter. It is to be understood that the above description is intended to be illustrative, and not restrictive. The scope of the present subject matter should be determined with reference to the appended claims, along with the full scope of equivalents to which such claims are entitled.

What is claimed is:

1. A method for testing a capacitor having a first and second terminal, the method comprising:
   heating the capacitor to a first temperature;
   applying a first voltage to the capacitor between the first and second terminals;
   maintaining the first temperature and the first voltage for a first interval of time;
   reducing the temperature of the capacitor to a second temperature at the conclusion of the first interval of time;
   shorting the capacitor for a second interval;
   monitoring current between the first and second terminals at the conclusion of the second interval of time;
   heating the capacitor to a third temperature;
   plotting the monitored current as a function of temperature;
   identifying a first inflection point of the plot; and
   using the current at the inflection point to determine current leakage of the capacitor.

2. The method of claim 1, wherein the first temperature is no more than the rated operating temperature of the capacitor degrees Celsius.

3. The method of claim 1, wherein the first temperature is 175 degrees Celsius.

4. The method of claim 1, wherein the first voltage is the rated voltage of the capacitor.

5. The method of claim 1, wherein the first voltage is between 6.3 and 16 volts.

6. The method of claim 1, wherein the capacitor has a capacitance between 1 nanofarad and 100 microfarads.

7. The method of claim 1, wherein the first interval is between 5 minutes and 500 minutes.

8. The method of claim 1, wherein the second temperature is 30 degrees Celsius.

9. The method of claim 1, wherein reducing the temperature includes reducing the temperature at a fixed rate.

10. The method of claim 1, wherein heating the capacitor to a first temperature includes heating the capacitor at a fixed rate.

11. The method of claim 1, wherein heating the capacitor to a third temperature includes heating the capacitor at a fixed rate.

12. The method of claim 11, wherein the fixed rate is about 7 degrees Celsius per minute.

13. The method of claim 12, wherein identifying a peak amperage includes identifying a peak amperage between 150 and 250 degrees Celsius.

14. The method of claim 1, further comprising:
   identifying a peak amperage at a high temperature than the first inflection point;
   repeating the method at least twice for the capacitor; and using the variability of the peak amperage as an indication of capacitor current leakage.

15. The method of claim 1, wherein the voltage is greater than the maximum rated operating voltage of the capacitor and the voltage does not cause dielectric breakdown.

16. The method of claim 15, wherein the first voltage is between about 6.3 volts and about 16 volts.

17. The method of claim 1, wherein the first interval of time is between about 5 and 500 minutes.

18. The method of claim 1, wherein the first interval of time is about 15 minutes.

19. The method of claim 18, wherein the second temperature is about 30 degrees Celsius.

20. The method of claim 1, further comprising maintaining the second temperature for about 10 minutes.

* * * * *